(12) United States Patent
Minami et al.

(10) Patent No.: US 9,343,495 B2
(45) Date of Patent: May 17, 2016

(54) SOLID-STATE IMAGING DEVICE AND METHOD OF MANUFACTURING THE SAME

(71) Applicant: KABUSHIKI KAISHA TOSHIBA, Tokyo (JP)

(72) Inventors: Takaaki Minami, Ooita (JP); Shoichi Hirooka, Fukuoka (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 141 days.

(21) Appl. No.: 14/194,422

(22) Filed: Feb. 28, 2014

(65) Prior Publication Data
US 2015/0028405 A1 Jan. 29, 2015

(30) Foreign Application Priority Data
Jul. 26, 2013 (JP) ................. 2013-155182

(51) Int. Cl.
*H01L 31/062* (2012.01)
*H01L 31/113* (2006.01)
*H01L 27/146* (2006.01)

(52) U.S. Cl.
CPC ...... *H01L 27/14629* (2013.01); *H01L 27/1463* (2013.01); *H01L 27/1464* (2013.01); *H01L 27/14685* (2013.01); *H01L 27/14621* (2013.01); *H01L 27/14627* (2013.01); *H01L 27/14689* (2013.01)

(58) Field of Classification Search
USPC ........... 257/291–294, 432; 348/294, 300, 308
See application file for complete search history.

(56) References Cited

U.S. PATENT DOCUMENTS

| 7,310,280 | B2 | 12/2007 | Park et al. | |
| 2012/0261783 | A1* | 10/2012 | Prima | ............... H01L 27/14603 257/447 |
| 2013/0033628 | A1 | 2/2013 | Yamaguchi | |
| 2013/0070131 | A1* | 3/2013 | Ohkubo | ............ H01L 27/14623 348/294 |

FOREIGN PATENT DOCUMENTS

| JP | 2006186359 A | 7/2006 |
| JP | 2008103019 A | 5/2008 |
| JP | 2008147333 A | 6/2008 |
| JP | 2010277656 A | 12/2010 |

(Continued)

OTHER PUBLICATIONS

Jae-Duk Lee et al., A New Programming Disturbance Phenomenon in NAND Flash Memory by Source/Drain Hot-Electrons Generated by GIDL Current, IEEE, 2006, 3 pages.

(Continued)

*Primary Examiner* — Errol Fernandes
(74) *Attorney, Agent, or Firm* — Patterson & Sheridan, LLP (57) ABSTRACT

A solid-state imaging device includes a semiconductor layer, a reflector, and a plurality of element separating regions. In the semiconductor layer, a plurality of photoelectric conversion elements is arranged in a two-dimensional array. The reflector covers a surface of the semiconductor layer on a side opposite to a surface of the semiconductor layer on which alight is incident, and reflects the light. The element separating regions are formed in the semiconductor layer to physically and electrically separate the plurality of photoelectric conversion elements. Each of the element separating regions extend from the surface of the semiconductor layer on which the light is incident to the reflector and has a reflection surface for reflecting light.

20 Claims, 6 Drawing Sheets

(56) References Cited

FOREIGN PATENT DOCUMENTS

| | | | |
|---|---|---|---|
| JP | 2011192898 A | 9/2011 | |
| JP | 2013065688 A | 4/2013 | |
| TW | 201300926 A | 1/2013 | |
| TW | 201314276 A | 4/2013 | |

OTHER PUBLICATIONS

Taiwanese Office Action dated Oct. 21, 2015, filed in Taiwan counterpart Application No. 103107429, 5 pages (with translation).

* cited by examiner

SOLID-STATE IMAGING DEVICE AND METHOD OF MANUFACTURING THE SAME

CROSS-REFERENCE TO RELATED APPLICATION

This application is based upon and claims the benefit of priority from Japanese Patent Application No. 2013-155182, filed Jul. 26, 2013, the entire contents of which are incorporated herein by reference.

FIELD

An embodiment described herein relates to a solid-state imaging device and a method of manufacturing the same.

BACKGROUND

Conventionally, electronic equipment such as a digital camera or a personal digital assistant provided with a camera function includes a camera module with a solid-state imaging device. The solid-state imaging device includes a plurality of photoelectric conversion elements arranged in a two-dimensional array corresponding to respective pixels of an image. Each photoelectric conversion element performs photoelectric conversion where incident light is converted into a charge whose amount corresponds to an amount of light received, and stores the charge as a signal indicating brightness of each pixel.

Such a solid-state imaging device includes a front-surface-irradiation type solid-state imaging device and a back-surface-irradiation type solid-state imaging device. In the front-surface-irradiation type solid-state imaging device, the front surface of a semiconductor layer on which photoelectric conversion elements are arranged is the light receiving surface, and a wiring layer is formed on the light receiving surface. On the other hand, in the back-surface-irradiation type solid-state imaging device, the back surface of a semiconductor layer on which photoelectric conversion elements are arranged is the light receiving surface, and a wiring layer is formed on the front surface of the semiconductor layer.

In this manner, in the back-surface-irradiation type solid-state imaging device, the wiring layer does not reside on the light receiving surface for each photoelectric conversion element and hence, the back-surface-irradiation type solid-state imaging device receives the light more efficiently than the front-surface-irradiation type solid-state imaging device. However, in the back-surface-irradiation type solid-state imaging device, it is necessary to expose the light receiving surface of each photoelectric conversion element by decreasing a thickness of the semiconductor layer by grinding from the back surface side. Hence, a portion of light received passes through the semiconductor layer whose thickness is decreased thus giving rise to a drawback that light reception sensitivity is lowered.

DETAILED DESCRIPTION

According to an embodiment, there is provided a solid-state imaging device that improves light reception sensitivity and a method of manufacturing the solid-state imaging device.

In general, according to one embodiment, there is provided a solid-state imaging device. The solid-state imaging device includes a semiconductor layer, a reflector, and a plurality of element separating regions. In the semiconductor layer, a plurality of photoelectric conversion elements is arranged in a two-dimensional array. The reflector covers a surface of the semiconductor layer on a side opposite to a surface of the semiconductor layer on which a light is incident and reflects light incident thereon. The element separating regions are formed in the semiconductor layer to physically and electrically separate the plurality of photoelectric conversion elements. Each element separating region extends from the surface of the semiconductor layer on which the light is incident to the reflector and has a reflection surface for reflecting light.

Hereinafter, a solid-state imaging device and a method of manufacturing a solid-state imaging device of the embodiment are explained in detail with reference to drawings. The present disclosure is not limited by the embodiment.

Figure 1:
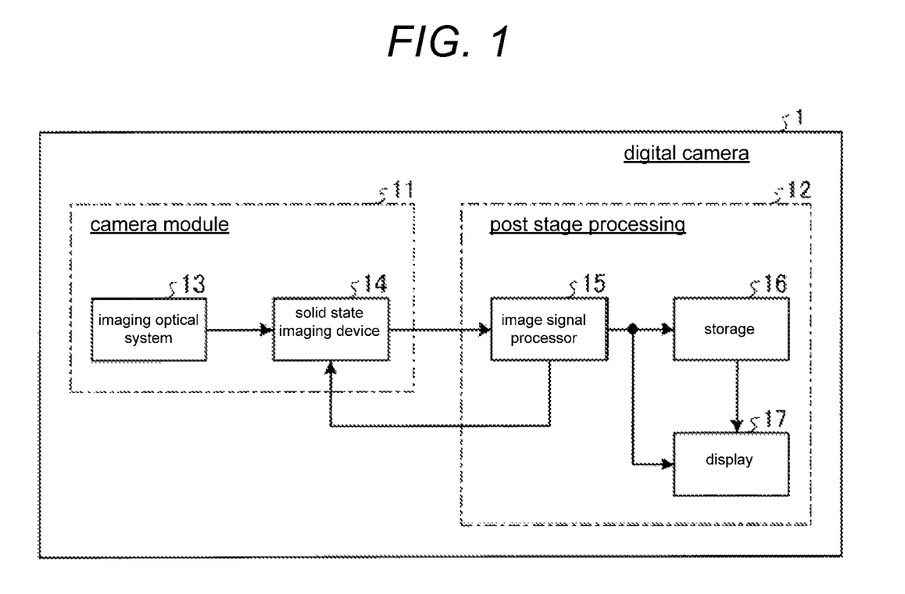
FIG. 1 is a block diagram depicting the schematic constitution of a digital camera provided with a solid-state imaging device according to an embodiment.

FIG. 1 is a block diagram depicting the schematic constitution of a digital camera 1 provided with a solid-state imaging device 14 according to the embodiment. As shown in FIG. 1, the digital camera 1 includes a camera module 11 and a post-stage processing part 12.

The camera module 11 includes an imaging optical system 13 and a solid-state imaging device 14. The imaging optical system 13 receives light from an object to be imaged and forms an object image. The solid-state imaging device 14 captures the object image formed by the imaging optical system 13, and outputs image signals to the post-stage processing part 12. The camera module 11 is not only applicable to the digital camera 1, but also to electronic equipment such as a personal digital assistant provided with a camera, for example.

The post-stage processing part 12 includes an Image Signal Processor (ISP) 15, a storage part 16, and a display part 17. The ISP 15 performs signal processing of image signals received from the solid-state imaging device 14. The ISP 15 performs image quality improvement processing such as noise removal processing, defective pixel correction processing, or resolution conversion processing, for example.

Figure 2:
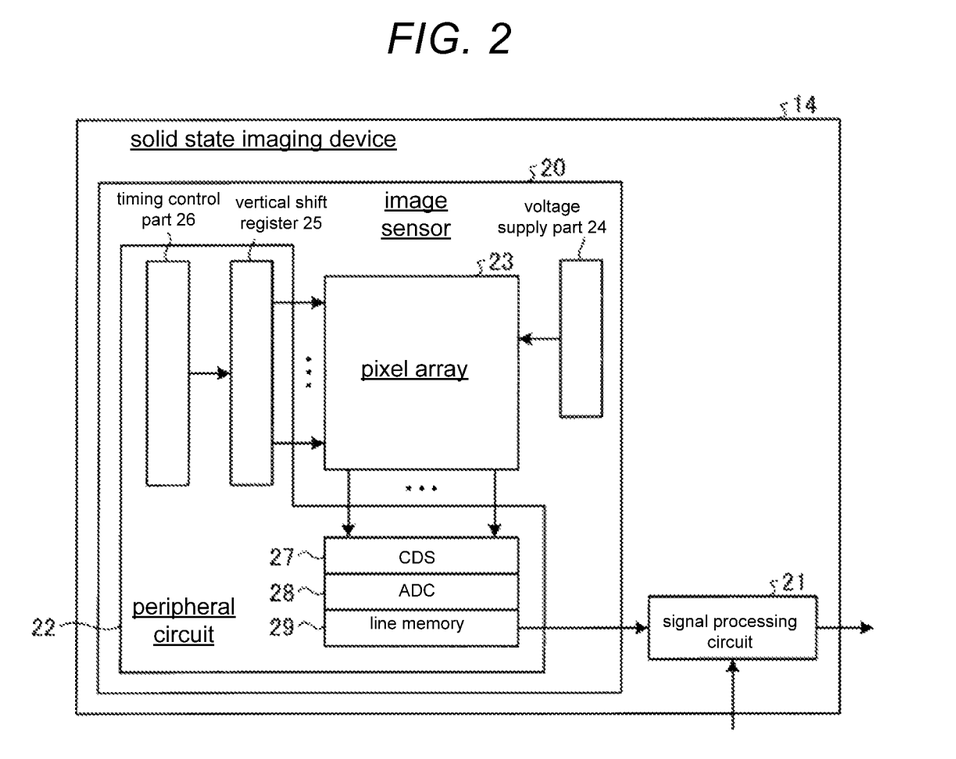
FIG. 2 is a block diagram depicting the schematic constitution of the solid-state imaging device according to the embodiment.

After such signal processing, the ISP 15 sends the image signals to the storage part 16, the display part 17 and a signal processing circuit 21, described below, and included in the solid-state imaging device 14 (see FIG. 2). The image signal fed back to the camera module 11 from the ISP 15 is used for adjusting or controlling the solid-state imaging device 14.

The storage part 16 stores image signals sent from the ISP 15 as an image. The storage part 16 sends the image signals of the stored image to the display part 17 in response to a manipulation by a user or the like. The display part 17 displays an image corresponding to image signals sent from the ISP 15 or the storage part 16. The display part 17 is a liquid crystal display, for example.

Next, the solid-state imaging device 14 included in the camera module 11 is explained with reference to FIG. 2. FIG. 2 depicts a block diagram illustrating the elements in the solid-state imaging device 14 of the embodiment. As depicted in FIG. 2, the solid-state imaging device 14 includes an image sensor 20 and a signal processing circuit 21.

In this embodiment, the image sensor 20 is a so-called back-surface-irradiation type Complementary Metal Oxide Semiconductor (CMOS) image sensor. In this arrangement, a wiring layer is formed on a surface of a photoelectric conversion element which performs photoelectric conversion on a side opposite to a surface of the photoelectric conversion element on which light is incident.

The image sensor 20 includes a peripheral circuit 22, a pixel array 23, and a voltage supply part 24. The peripheral circuit 22 includes a vertical shift register 25, a timing control part 26, a CDS (correlation double sampling part) 27, an ADC (analogue-digital conversion part) 28, and a line memory 29.

The pixel array 23 is arranged in an imaging region of the image sensor 20. A plurality of photoelectric conversion elements, which correspond to respective pixels of the image, are arranged in the pixel array 23 in a two-dimensional array (matrix array) in the horizontal direction (row direction) and in the vertical direction (column direction). In the pixel array 23, each photoelectric conversion element, which corresponds to each pixel, generates and stores a signal charge (electrons, for example) corresponding to an amount of incident light.

The timing control part 26 is a processing part that sends a pulse signal that forms a timing reference for operating the vertical shift register 25. The vertical shift register 25 is a processing part that sends a selection signal for sequentially selecting the photoelectric conversion elements from which a signal charge is read, in accordance with each row, out of the plurality of photoelectric conversion elements arranged in a two-dimensional array (matrix array).

The pixel array 23 transmits signal charges stored in the respective photoelectric conversion elements that are selected in accordance with each row in response to a selection signal sent from the vertical shift register 25 to the CDS 27 from the photoelectric conversion element as pixel signals indicative of the brightness of respective pixels.

The CDS 27 is a processing part that removes noise from a pixel signal sent from the pixel array 23 by correlated double sampling, and transmits the pixel signal to the ADC 28. The ADC 28 is a processing part that converts an analog pixel signal sent from the CDS 27 to a digital pixel signal and sends the digital pixel signal to the line memory 29. The line memory 29 is a processing part that temporarily holds the pixel signal sent from the ADC 28, and transmits the pixel signal to the signal processing circuit 21 for every row of the photoelectric conversion elements in the pixel array 23.

The signal processing circuit 21 is a processing part that performs predetermined signal processing on a pixel signal sent from the line memory 29, and transmits the pixel signal to the post-stage processing part 12. The signal processing circuit 21 performs signal processing such as lens shading correction, damage correction, or noise reduction processing on a pixel signal, for example.

The voltage supply part 24 is a part that applies a negative voltage to a reflector and an element separating region, described below, which are arranged in the pixel array 23 thus reducing the effects of dark current. The reduction of dark current is explained below with reference to FIG. 3.

In this manner, the image sensor 20 performs imaging such that the plurality of photoelectric conversion elements arranged in the pixel array 23 perform photoelectric conversion of incident light into signal charges of amounts corresponding to amounts of light received and stores the signal charges therein. The peripheral circuit 22 reads out the signal charges stored in the respective photoelectric conversion elements as pixel signals.

The image sensor 20 is configured such that a light from an object to be imaged is efficiently received by the respective photoelectric conversion elements of the pixel array 23 so that light reception sensitivity of the image sensor 20 is improved. Hereinafter, the pixel array 23 having an arrangement that improves light reception sensitivity is explained.

Figure 3:
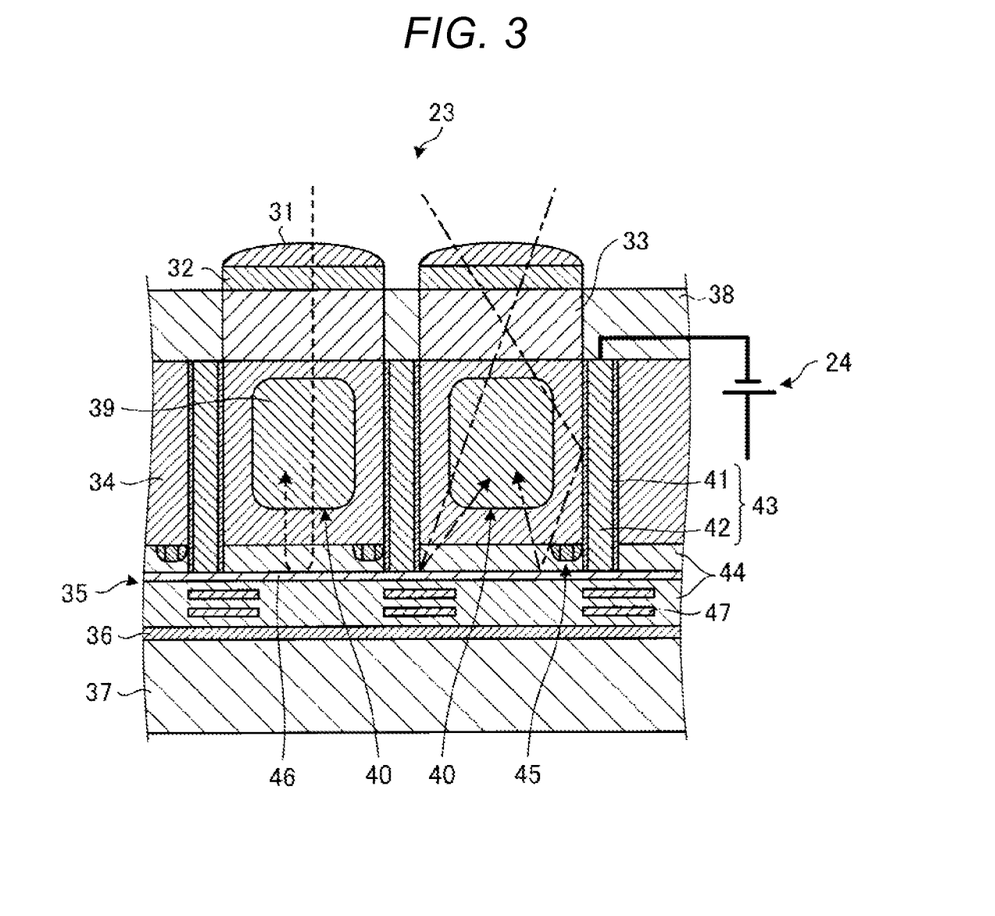
FIG. 3 is an explanatory view depicting the cross-sectional structure of a pixel array according to the embodiment.

In this embodiment, the cross-sectional structure of the pixel array 23, viewed in a cross section taken along the direction perpendicular to a light receiving surface of the pixel array 23, is described with reference to FIG. 3. In FIG. 3, the voltage supply part 24 is schematically expressed by a circuit symbol indicating a DC power source (battery).

As depicted in FIG. 3, the pixel array 23 includes, in order from a side on which a light is incident: microlenses 31; color filters 32; waveguides 33; P-type semiconductor (Si: silicon in this embodiment) layers 34; a multilayer wiring layer 35; an adhesive layer 36; and a support substrate 37.

The microlens 31 is a planoconvex lens, which converges incident light. The color filter 32 is a filter that allows any one of color lights including a red color light, a green color light, a blue color light, and a white color light to selectively pass therethrough. The waveguide 33 is a region which guides light that passes through the color filter 32 to a P-type Si layer 34 side and is made of Si nitride, for example. A protective film 38 made of Si oxide, for example, is formed around the waveguide 33.

The P-type Si layer 34 is a region that is formed by epitaxially growing Si doped with a P-type dopant such as boron, for example. The P-type Si layer 34 can be formed such that an Si wafer is doped with a P-type dopant by ion implantation.

An N-type Si region 39 is formed in the P-type Si layer 34 at a position where a photoelectric conversion element 40 is formed. In the pixel array 23, a photo diode formed by PN junction between the P-type Si layer 34 and the N-type Si region 39 constitutes the photoelectric conversion element 40.

Element separating regions 43 are formed in the P-type Si layer 34 as follows. The element separating region 43 reaches a reflector 46, described below, which is formed in the multilayer wiring layer 35 from the surface of the P-type Si layer 34 on which the light is incident such that the element separating region 34 physically separates the P-type Si layer 34 for every photoelectric conversion element 40.

The element separating region 43 includes a conductive member 42 where a peripheral surface, except for a bonding surface with the reflector 46, is covered with an insulation film 41. The conductive member 42 is made of metal, which reflects light, such as copper, aluminum or tungsten, for example. The element separating region 43 electrically separates the respective photoelectric conversion elements 40 from each other using the insulation film 41 formed on a peripheral surface thereof. The element separating region 43 optically separates the respective photoelectric conversion elements 40 from each other by making an interface between the insulation film 41 and the conductive member 42 function as a reflection surface for reflecting a light.

The multilayer wiring layer 35 includes: an interlayer insulation film 44 formed on a surface of the P-type Si layer 34 on a side opposite to a surface of the P-type Si layer 34 on which light is incident; a reading gate 45 which is formed in the interlayer insulation film 44, the reflector 46; and wiring 47. The adhesive layer 36 and the support substrate 37 are described below.

The reading gate 45 is a gate of a read transistor that reads out a signal charge to a floating diffusion (not shown) from each photoelectric conversion element 40. The wiring 47 transmits a control signal or the like to the respective semiconductor elements formed in the pixel array 23.

The reflector 46 is arranged in such a manner that the reflector 46 covers the surface of the P-type Si layer 34 on a side opposite to the surface of the P-type Si layer 34 on which light is incident. The reflector 46 reflects light that passes through the respective photoelectric conversion elements 40 toward a side of a photoelectric conversion element 40. The reflector 46 is made of the same metal material as the wiring 47 such as copper or aluminum, for example.

There is a high possibility that a light which passes through the photoelectric conversion element 40 and reaches the reflector 46 is a red color light having a longer wavelength than a blue color light or a green color light among light of three primary colors. Accordingly, the material for forming the reflector 46 is not limited to a metal material; any material may be used provided that the material has a smaller light refractive index than the interlayer insulation film 44 interposed between the reflector 46 and the P-type Si layer 34, and reflects at least red color light.

As described in this embodiment, when a material for forming the interlayer insulation film 44 is Si oxide, the reflector 46 may be formed of a material other than a metal material that has a lower light refractive index than Si oxide and reflects red color light. That is, the reflector 46 may be formed of a material formed by adding carbon or fluorine to Si oxide.

In this manner, the pixel array 23 includes the reflector 46 which covers the surface of the P-type Si layer 34 on a side opposite to the surface of the P-type Si layer 34 on which the plurality of photoelectric conversion elements 40 is arranged in a two-dimensional array and on which a light is incident, and reflects the light.

Owing to such a constitution, as indicated by a dotted arrow line in FIG. 3, even when a light, which is incident on the photoelectric conversion element 40, passes through the photoelectric conversion element 40, the light which passes through the photoelectric conversion element 40 is reflected to a photoelectric conversion element 40 side by the reflector 46. Accordingly, the pixel array 23 of this embodiment makes the photoelectric conversion elements 40 receive light incident on the pixel array 23 without loss, thus improving light reception sensitivity.

In the pixel array 23, as described above, to physically separate the P-type Si layer 34 for every photoelectric conversion element 40 by the element separating region 43 having a reflection surface for reflecting a light, the element separating region 43 is formed in the P-type Si layer 34 having a depth that extends from the surface of the P-type Si layer 34 on which the light is incident to the reflector 46. That is, each photoelectric conversion element 40 is in a state where the surfaces except for the surface on a side where the light is incident (light receiving surface) are surrounded by the element separating regions 43 and the reflector 46.

Owing to such a constitution, as indicated by a chained line arrow in FIG. 3, even when a light incident on the pixel array 23 in the arbitrary oblique direction passes through the photoelectric conversion element 40, the pixel array 23 reflects the light that passes through the photoelectric conversion element 40 toward the photoelectric conversion element 40 side by reflection surfaces of the element separating regions 43 and the reflector 46.

Accordingly, the pixel array 23 makes the photoelectric conversion element 40 receive light also incident on the pixel array 23 in an arbitrary oblique direction without loss, thus improving light reception sensitivity.

In the pixel array 23, there may be a case where electrons are generated independent of the incident light due to a defect in crystal, contamination or the like on an end surface of the P-type Si layer 34. Such electrons generated independent of the incident light generate a dark current. The dark current is detected by the image sensor 20 and appears as a white defect in the image thus deteriorating image quality.

In view of the above, in this embodiment, the image sensor 20 includes the voltage supply part 24 that supplies a negative voltage to the conductive member 42 of the element separating region 43 and the reflector 46, thus reducing a dark current. The voltage supply part 24 is connected to the conductive member 42 of the element separating region 43 at one point on the P-type Si layer 34 on a surface side on which a light is incident.

In this embodiment, the element separating region 43 is formed in a matrix array, viewed in a plan view, to physically separate the P-type Si layer 34. Accordingly, by connecting the voltage supply part 24 to one point of the conductive member 42 of the element separating region 43, the voltage supply part 24 applies a negative voltage to the whole conductive member 42 that surrounds the plurality of photoelectric conversion elements 40.

The conductive member 42 of the element separating region 43 and the reflector 46 are made conductively continuous. Accordingly, when a negative voltage is applied to the conductive member 42 of the element separating region 43 by the voltage supply part 24, both the conductive member 42 and the reflector 46 receive a negative potential.

Accordingly, holes are attracted to an area in the vicinity of a bonding surface between the P-type Si layer 34 and the interlayer insulation film 44 and to an area in the vicinity of a bonding surface between the P-type Si layer 34 and the element separating region 43 thus forming reverse regions where an electric characteristic is reversed. The pixel array 23 of this embodiment recombines holes generated in the reverse region and electrons generated on the end surface of the P-type Si layer 34, independently of incident light, thus reducing dark current.

Next, a method of manufacturing the solid-state imaging device 14 according to the embodiment is explained with reference to FIG. 4A through FIG. 6C. A method of manufacturing portions of the solid-state imaging device 14 other than the pixel array 23 is substantially the same as a method of manufacturing corresponding portions of a CMOS image sensor used in general. Accordingly, the method of manufacturing the portions of the pixel array 23 of the solid-state imaging device 14 is explained hereinafter.

FIG. 4A through FIG. 6C are cross-sectional schematic views depicting manufacturing steps of the solid-state imaging device 14 according to the embodiment. In FIG. 4A through FIG. 6C, manufacturing steps of the portions of the pixel array 23 depicted in FIG. 3 are selectively depicted.

Figure 4A:
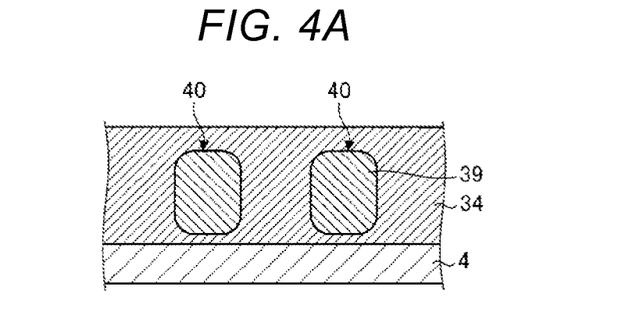
FIGS. 4A to 4D are cross-sectional schematic views depicting manufacturing steps of the solid-state imaging device according to the embodiment.

As depicted in FIG. 4A, in manufacturing the pixel array 23, a P-type Si layer 34 is formed on a semiconductor substrate 4 such as a Si wafer. The P-type Si layer 34 is formed, for example, by epitaxially growing a Si layer doped with a P-type dopant such as boron on the semiconductor substrate 4. The P-type Si layer 34 may be formed such that a Si wafer is doped with a P-type dopant by ion implantation and, then, an annealing treatment is applied to the Si wafer.

Subsequently, an N-type dopant such as phosphorus, for example, is injected into an area in the P-type Si layer 34 where the photoelectric conversion element 40 is formed by ion implantation, and annealing treatment is applied to the area, thus forming an N-type Si region 39. By such treatment, in the pixel array 23, a photoelectric conversion element 40, a photo diode, is formed by a PN junction between the P-type Si layer 34 and the N-type Si region 39.

Figure 4B:
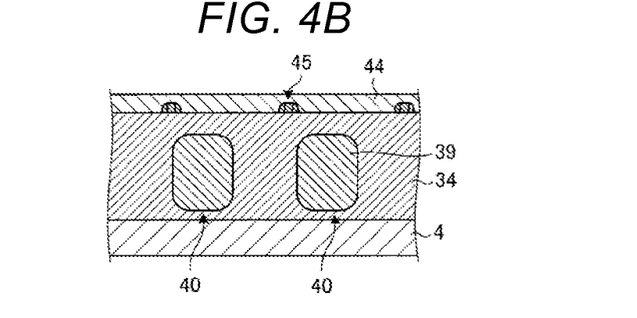

Then, as shown in FIG. 4B, reading gates 45 are formed on the P-type Si layer 34 and, thereafter, Si oxide is laminated on the reading gates 45 and the P-type Si layer 34 by a Chemical Vapor Deposition (CVD), for example, thus forming an interlayer insulation film 44.

Figure 4C:
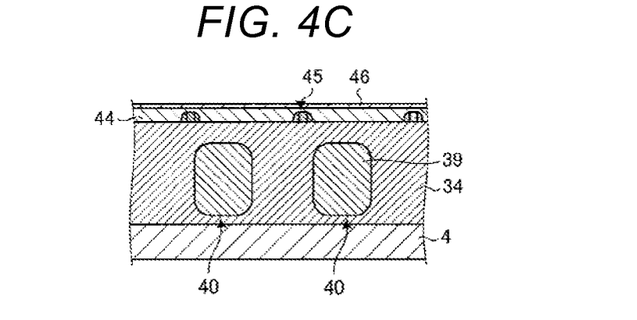

Subsequently, as shown in FIG. 4C, a reflector 46 is formed on the interlayer insulation film 44. The reflector 46 is formed by forming a copper film such that the copper film covers regions of the P-type Si layer 34 where the photoelectric conversion elements 40 are formed respectively, for example.

Although not shown, in the step of forming the reflector 46, a copper film is formed and, thereafter, a predetermined patterning is applied to the copper layer on the same layer where the reflector 46 is formed, for example. In this case, a wiring 47 which constitutes a first layer is formed simultaneously with the formation of the reflector 46.

In this manner, the reflector 46 is simultaneously formed in the step of forming the wiring 47 which constitutes the first layer. Accordingly, by merely forming a pattern of the reflector 46 at the time of patterning the wiring 47 that constitutes the first layer, the reflector 46 may be formed without additionally providing a step of forming the reflector 46.

Figure 4D:
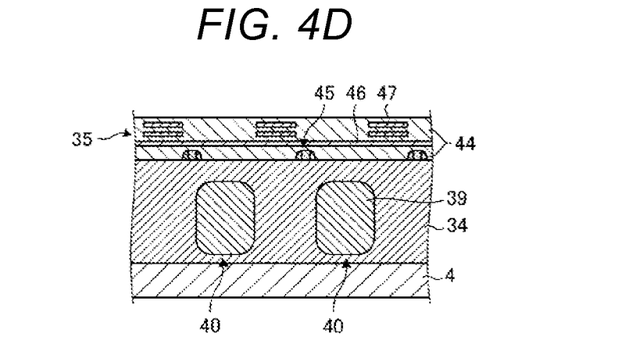

Thereafter, on the reflector 46, the step of forming the interlayer insulation film 44, the step of forming a predetermined wiring pattern of the interlayer insulation film 44, and the step of forming the wiring 47 by embedding, for example, copper or the like in the wiring pattern are repeated. By such steps, a multi-layered wiring layer 35 shown in FIG. 4D is formed.

Figure 5A:
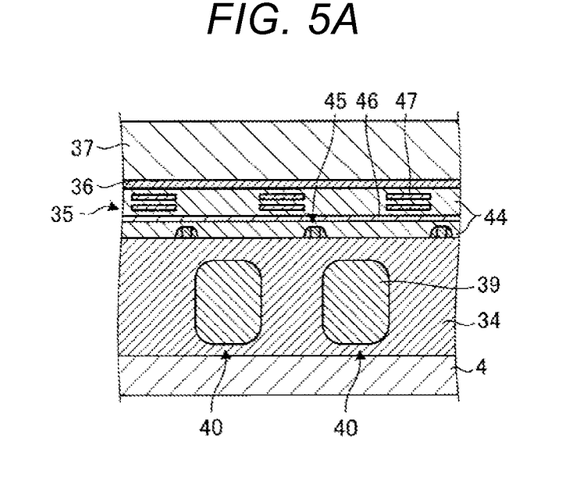
FIGS. 5A to 5C are cross-sectional schematic views depicting subsequent manufacturing steps of the solid-state imaging device according to the embodiment.

Subsequently, as shown in FIG. 5A, an adhesive agent is applied to an upper surface of the multilayer wiring layer 35 by coating thus forming an adhesive layer 36, and a support substrate 37 formed of a Si wafer or the like, for example, is adhered to an upper surface of the adhesive layer 36. Thereafter, the structural body shown in FIG. 5A is turned upside down and, thereafter, the semiconductor substrate 4 is ground from a back surface side (from an upper surface side in this embodiment) by a grinding apparatus such as a grinder, for example, thus reducing a thickness of the semiconductor substrate 4 to an extent that the semiconductor substrate 4 has a predetermined thickness.

Figure 5B:
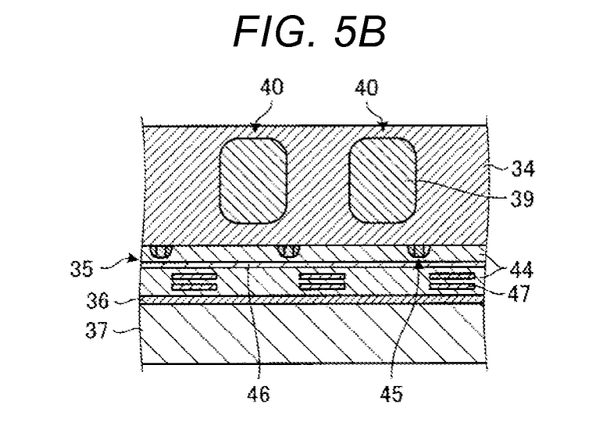

Then, the back surface side of the semiconductor substrate 4 is further ground by a Chemical Mechanical Polishing (CMP), for example, and a back surface (upper surface in this embodiment) of the P-type Si layer 34 which constitutes a light receiving surface is exposed as shown in FIG. 5B.

Figure 5C:
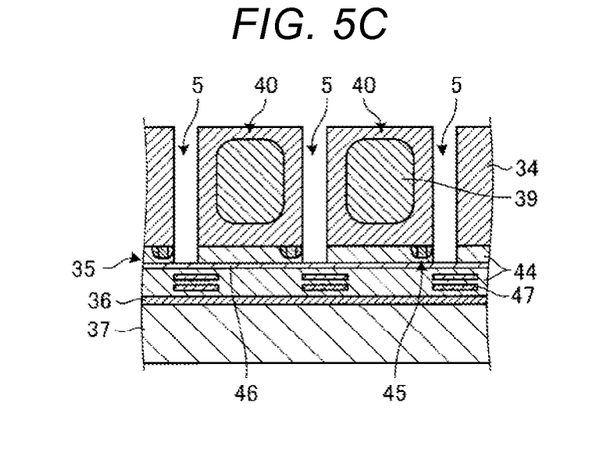

Thereafter, as shown in FIG. 5C, trenches 5 for separating elements are formed in the P-type Si layer 34 at positions where the element separating regions 43 (see FIG. 3) are formed, that is, at positions between the respective N-type Si regions 39. In the step of forming the trenches 5, for example, the trenches 5 are formed from an upper surface of the P-type Si layer 34 to a position slightly short of a position where the trenches 5 reach the reflector 46 by a Reactive Ion Etching (RIE) and, thereafter, wet etching is applied to the P-type Si layer 34 thus making the trenches 5 reach the reflector 46.

Figure 6A:
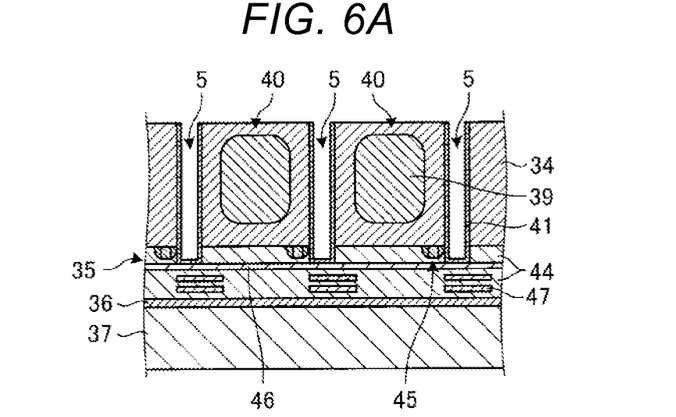
FIGS. 6A to 6C are cross-sectional schematic views depicting subsequent manufacturing steps of the solid-state imaging device according to the embodiment.
Figure 6B:
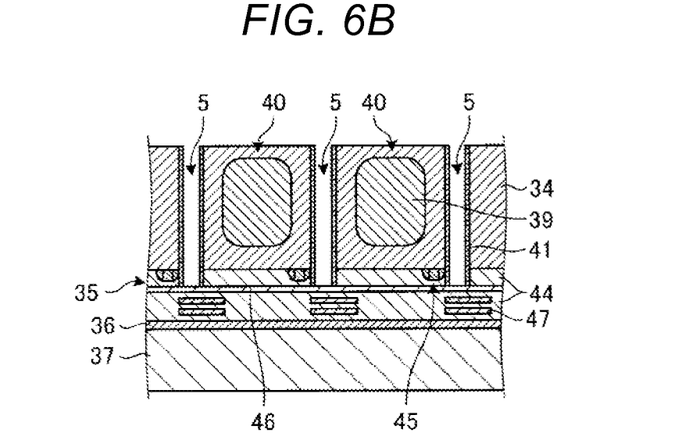

Subsequently, as shown in FIG. 6A, an insulation film 41 made of Si oxide or the like is formed on inner peripheral surfaces of each trench 5 by the CVD or sputtering, for example. Thereafter, anisotropic etching is applied to the inner portion of each trench 5 so that the insulation film 41 on a bottom surface of each trench 5 is selectively removed while leaving the insulation film 41 on side surfaces of each trench 5 as shown in FIG. 6B.

Figure 6C:
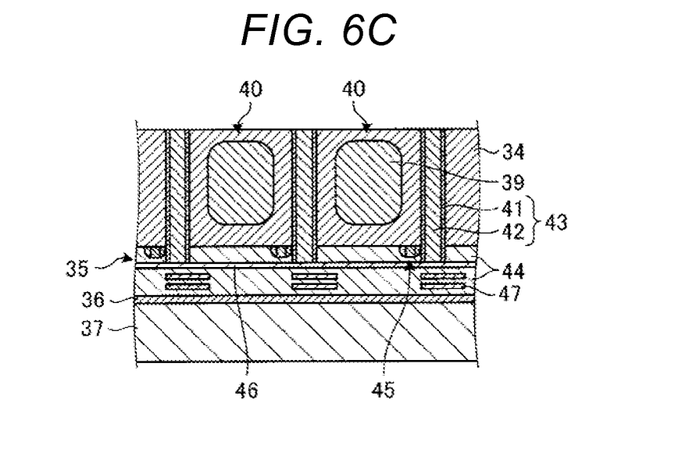

Then, a conductive member 42 such as copper is embedded into the inside of each trench 5 where the side surfaces other than the bottom surface are covered with the insulation film 41 by sputtering or the like, for example, thus forming an element separating region 43 as shown in FIG. 6C.

Thereafter, as shown in FIG. 3, the conductive members 42 and the voltage supply part 24 are connected to each other on an upper surface side of the element separating region 43, and the waveguides 33 and the protective film 38 are formed and, thereafter, the color filters 32 and the microlenses 31 are sequentially formed thus forming the pixel array 23.

As described above, the solid-state imaging device according to the embodiment includes the reflector which reflects a light on the surface of the semiconductor layer on a side opposite to the surface of the semiconductor layer on which the plurality of photoelectric conversion elements are formed and on which a light is incident. Further, the solid-state imaging device includes the element separating regions which are formed having a depth that extends from the surface of the semiconductor layer on which the light is incident to the reflector such that the element separating regions surround the respective photoelectric conversion elements in a matrix array as viewed in a plan view whereby the photoelectric conversion elements are electrically separated from each other. The element separating region also has reflection surfaces for reflecting light. That is, the photoelectric conversion element, according to the embodiment, has surfaces, except for a surface on a side on which a light is incident (light receiving surface), surrounded by the element separating regions and the reflector has a light reflection function.

Owing to such a construction, in the solid-state imaging device according to the embodiment, even when light, which is incident on the light receiving surface of the photoelectric conversion element in an arbitrary direction, passes through the photoelectric conversion element, the light that passes through the photoelectric conversion element is reflected toward a photoelectric conversion element side by the element separating regions and the reflector. According to the solid-state imaging device of the embodiment, the respective photoelectric conversion elements receive light incident thereon without a loss and, thus light reception sensitivity is improved.

The construction of the element separating region 43 is not limited to the above-mentioned configuration.

Figure 7:
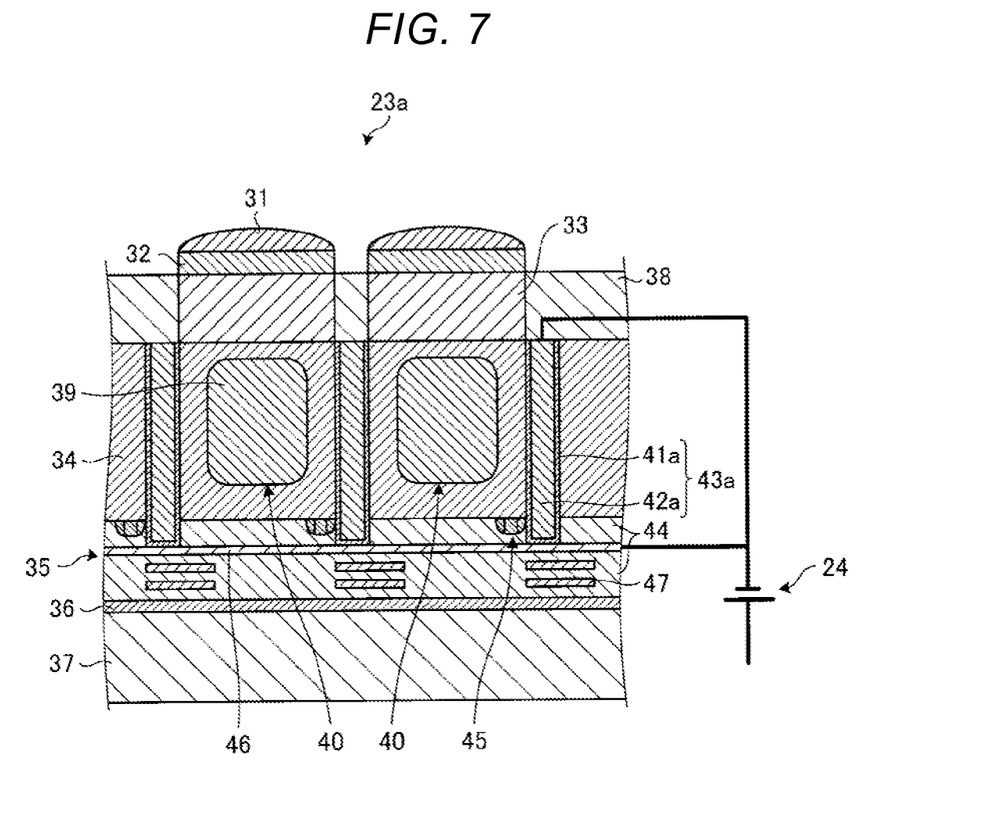
FIG. 7 is an explanatory view depicting the cross-sectional structure of a pixel array according to a modification of the embodiment.

A modification of the construction of the element separating region 43 is explained with reference to FIG. 7. FIG. 7 is an explanatory view depicting the cross-sectional structure of a pixel array 23a according to the modification of the embodiment.

In this modification, constitutional elements depicted in FIG. 7 and having the same function as the constitutional elements shown in FIG. 3 are given the same symbols shown in FIG. 3, and the repeated explanation of these elements is omitted.

As shown in FIG. 7, a pixel array 23a according to the modification differs from the pixel array 23 shown in FIG. 3 with respect to the construction of the element separating region 43a in that a voltage supply part 24 is connected to an element separating region 43a and a reflector 46 individually.

To be more specific, the conductive member 42a of the element separating region 43a is covered with an insulation film 41a not only on side surfaces thereof but also on a bottom surface thereof. However, in the same manner as the element separating region 43 shown in FIG. 6C, the element separating region 43a also has a bottom surface thereof bonded to the reflector 46.

Owing to such a constitution, also according to the modified pixel array 23a, even when light that is incident on light receiving surface of a photoelectric conversion element 40 in an arbitrary direction, passes through the photoelectric conversion element 40, the light which passes through the photoelectric conversion element is reflected toward a photoelectric conversion element 40 side by the element separating regions 43a and the reflector 46. According to the modified solid-state imaging device, the respective photoelectric conversion elements 40 receive light incident thereon without a loss and hence, light reception sensitivity is improved.

Further, in the modification, the element separating region 43a of the modification is formed by covering inner peripheral surfaces of a trench 5 with an insulation film 41a as shown in FIG. 6A and, thereafter, by embedding an insulation member 42a into the inside of the trench 5 without removing the insulation film 41a on a bottom surface of the trench 5. Accordingly, the pixel array 23a of the modification may improve light reception sensitivity while reducing the number of manufacturing steps.

In this modification, however, the element separating region 43a and the reflector 46 are not conductively continuous. Accordingly, in the pixel array 23a, the voltage supply part 24 is connected to the conductive members 42a of the element separating regions 43a and the reflector 46 individually.

Owing to such a constitution, in the pixel array 23a, a negative voltage is supplied to the conductive members 42a of the element separating regions 43a and the reflector 46 from the voltage supply part 24 and hence, in the same manner as the pixel array 23 shown in FIG. 3, dark current is reduced.

A connection line which connects the voltage supply part 24 and the conductive members 42a of the element separating region 43a is formed in the step of forming a wiring 47 which constitutes a first layer and the reflector 46, for example, by simultaneously patterning the connection line. Accordingly, the voltage supply part 24 and the conductive members 42a are connected to each other without increasing the number of manufacturing steps.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising:
    a semiconductor layer in which a plurality of photoelectric conversion elements are arranged in a two-dimensional array;
    a reflector that covers a surface of the semiconductor layer on a side opposite to a surface of the semiconductor layer on which light is incident, and that reflects the light incident thereon;
    an element separating region formed in the semiconductor layer to physically and electrically separate the plurality of photoelectric conversion elements, the element separating region extending from the surface of the semiconductor layer on which light is incident to the reflector and having a plurality of reflection surfaces for reflecting light; and
    a voltage supply circuit that is configured to supply a negative voltage and is electrically connected to the element separating region, wherein
    the reflector is formed of a conductive member and the element separating region includes a conductive member, and
    the reflector and the element separating region are electrically connected so that the reflector is electrically connected to the voltage supply circuit through the element separation region.

2. The solid-state imaging device according to claim 1, wherein the conductive member of the element separating region includes the reflection surfaces, and the element separating region also includes a plurality of insulating films.

3. The solid-state imaging device according to claim 1, further comprising:
    an interlayer insulation film disposed between the reflector and the surface of the semiconductor layer on the side opposite to the surface of the semiconductor layer on which the light is incident; and
    a read transistor configured to read a charge from one of the photoelectric conversion elements, a gate of the read transistor being disposed in the interlayer insulation film.

4. The solid-state imaging device according to claim 1, further comprising a plurality of microlenses, each disposed over one of the photoelectric conversion elements.

5. The solid-state imaging device according to claim 4, further comprising a plurality of color filters, each disposed between one of the microlenses and one of the photoelectric conversion elements.

6. The solid-state imaging device according to claim 5, further comprising a plurality of waveguides, each disposed between one of the color filters and one of the photoelectric conversion elements.

7. The solid-state imaging device according to claim 1, wherein the conductive member of the element separating region is in contact with the reflector.

8. The solid-state imaging device according to claim 2, wherein each of the insulating films is disposed around one of the photoelectric conversion elements.

9. The solid-state imaging device according to claim 1, wherein the conductive member of the element separate region is formed of metal.

10. The solid-state imaging device according to claim 1, wherein the conductive member of the reflector is formed of metal.

11. A solid-state imaging device comprising:
    a semiconductor layer in which a plurality of photoelectric conversion elements are arranged in a two-dimensional array;
    a reflector that covers a surface of the semiconductor layer on a side opposite to a surface of the semiconductor layer on which light is incident, and that reflects the light incident thereon;
    an element separating region formed in the semiconductor layer to physically and electrically separate the plurality of photoelectric conversion elements, the element separating region extending from the surface of the semiconductor layer on which light is incident to the reflector and having a plurality of reflection surfaces for reflecting light; and a voltage supply circuit electrically connected to the element separating region and the reflector separately and configured to supply a negative voltage thereto.

12. The solid-state imaging device according to claim 11, wherein the element separating region includes a conductive member that includes the reflection surfaces and a plurality of insulating films.

13. The solid-state imaging device according to claim 12, wherein each of the insulating films is disposed around one of the photoelectric conversion elements.

14. The solid-state imaging device according to claim 12, wherein each of the insulating films is disposed between the conductive member and the reflector.

15. The solid-state imaging device according to claim 12, wherein the conductive member of the element separate region is formed of metal.

16. The solid-state imaging device according to claim 12, wherein the reflector is formed of metal.

17. The solid-state imaging device according to claim 11, further comprising:

an interlayer insulation film disposed between the reflector and the surface of the semiconductor layer on the side opposite to the surface of the semiconductor layer on which the light is incident; and a read transistor configured to read a charge from one of the photoelectric conversion elements, a gate of the read transistor being disposed in the interlayer insulation film.

18. The solid-state imaging device according to claim 11, further comprising a plurality of microlenses, each disposed over one of the photoelectric conversion elements.

19. The solid-state imaging device according to claim 18, further comprising a plurality of color filters, each disposed between one of the microlenses and one of the photoelectric conversion elements.

20. The solid-state imaging device according to claim 19, further comprising a plurality of waveguides, each disposed between one of the color filters and one of the photoelectric conversion elements.

* * * * *